United States Patent
Stengel

(10) Patent No.: US 7,129,720 B2
(45) Date of Patent: Oct. 31, 2006

(54) METHOD AND DEVICE FOR TESTING THE OPERATIVENESS OF PRINTED CIRCUIT BOARDS

(75) Inventor: Juergen Stengel, Heessen (DE)

(73) Assignee: Botest Systems GmbH, Kreuzwertheim (DE)

( * ) Notice: Subject to any disclaimer, the term of this patent is extended or adjusted under 35 U.S.C. 154(b) by 253 days.

(21) Appl. No.: 10/343,767

(22) PCT Filed: Aug. 1, 2001

(86) PCT No.: PCT/EP01/08882

§ 371 (c)(1),
(2), (4) Date: Feb. 4, 2003

(87) PCT Pub. No.: WO02/12911

PCT Pub. Date: Feb. 14, 2002

(65) Prior Publication Data

US 2004/0251889 A1 Dec. 16, 2004

(30) Foreign Application Priority Data

Aug. 5, 2000 (DE) ................................ 100 38 313

(51) Int. Cl.
*G01R 31/302* (2006.01)

(52) U.S. Cl. ....................................................... 324/750
(58) Field of Classification Search ................ 324/750, 324/755, 759, 763, 764, 765, 158.1
See application file for complete search history.

(56) References Cited

U.S. PATENT DOCUMENTS

| | | | |
|---|---|---|---|
| 5,177,437 A * | 1/1993 | Henley | ......................... 324/754 |
| 5,357,194 A | 10/1994 | Ullman et al. | |
| 5,680,056 A | 10/1997 | Ito et al. | |
| 6,727,711 B1 * | 4/2004 | Doi | ............................ 324/750 |

FOREIGN PATENT DOCUMENTS

EP  0 409 398  1/1991

\* cited by examiner

*Primary Examiner*—Jermele Hollington
*Assistant Examiner*—Trung Q. Nguyen

(57) ABSTRACT

A process for testing circuit boards for serviceability is designed such that a flexible layer (2) that is initially impermeable to current is placed directly on at least one side of the circuit board (1), making contact, and it is dynamically connected to a current conductor (3), the layer (2) is then energized and then a current passage is partially created at the contact points that delimit the respective conductor path (5) that is to be tested, and then the flow of current in the conductor path (5) is measured using the current conductor (3).

16 Claims, 1 Drawing Sheet

METHOD AND DEVICE FOR TESTING THE OPERATIVENESS OF PRINTED CIRCUIT BOARDS

This invention relates to a process for testing circuit boards for serviceability and a device for carrying out the process.

To test for serviceability of circuit boards, i.e. test for current flow within conductor paths both on one side of the circuit board and also from one side to the other, the expression "bareboard test system" discloses a process in which testing for electrical permeability of conductor paths takes place by elastic contact pins that are attached to both sides of the circuit board in a die and are configured in their arrangement according to the contact points.

In order to ensure reliable contact of the contact pins with the corresponding contact points, the dies are moved with a certain pressure against the circuit board, and the forces resulting from the springs of the contact pin must be overcome. For the host of contact pins that are conventionally used, considerable pressures that dictate a corresponding mechanical concept are necessary.

The equipment costs that must be borne here lead to considerable production costs of one such machine, another disadvantage being relatively great fault susceptibility that is caused especially by the large number of contact pins used, which can be in the range of 10,000 pieces.

The possible density of contact points that increases with newer technologies limits the use of contact pins so that the attainable resolution for making contact with circuit boards no longer keeps up with modern requirements.

Another process is known under the term "flying probe-tester". Here, 2 to 8 test needles at a time are positioned on the two sides of the circuit board by suitable movement units over the contact points of the circuit board for which the electrical permeability is to be determined. Contact-making between the test needles and the selected contact point on the circuit board takes place by lowering the test needles onto this point. The current proceeding from the first test needle is routed to the circuit board contact, and on the other end of the conductor path, it is likewise received and measured by one such test needle. In principle, it is testing by contact here, one test needle being assigned to each contact site of the conductor path not according to the described contact pins, but their being moved accordingly, computer-controlled. Here, there is the danger of damage of the contact points by multiple contact, with the consequence that problems in the component placement on the circuit board can occur.

In order to avoid this damage, attempts have already been made to replace the test needles by a conductive plasma by which contact with the contact points is established.

The disadvantage here, however, is that the speed within which the circuit board can be completely tested is relatively low, in particular based on the working steps: paired positioning of the test needles, lowering, measuring and moving to the next positions. These test systems rather quickly reach their resolution limits, i.e., operating limits, due to the size of the test needles and the only limited possible accuracy of the movement units.

Finally, U.S. Pat. No. 5,177,437 describes testing of circuit boards in which a matrix that can be photoelectrically activated by means of a light source is applied to the glass plate. Between the matrix and the circuit board, there is an electrically conductive mat. In any case, the construction cost for executing this process is relatively high. In addition, the interconnected mat and the matrix that is rigid compared to the circuit board cannot equalize or take into account production-induced unevenness and inaccuracies of the surface of the circuit board, such that an absolutely accurate test result is not guaranteed.

For operation, moreover, there are "light valves" designated as such, by which the emitted light beam of a continuous light source is masked and unmasked according to requirements. The construction cost here is extremely high and in addition to high production costs, it leads to fault susceptibility that prevents optimum operation.

Therefore, the object of this invention is to develop a process of the generic type such that it can be carried out with low equipment costs and high speed, higher test accuracy is achieved, and extremely small contact points of the circuit board can be tested.

This object is achieved by a process that has the features of claim 1.

The process according to the invention now enables testing that is extremely effective with respect to the working speed and that is nondestructive at the same time with respect to the circuit board.

Direct application of a flexible layer to at least one side of the circuit board, i.e., direct contact-making, on the one hand makes the structural cost much lower than in the known processes, and, on the other hand, ensures that production-induced unevenness of the circuit board is also taken into account. The layer that is initially impermeable to current rests directly on each point of the circuit board based on its flexible composition, so that almost no test in accuracies arise. The quality of the test result is thus much improved. This is therefore especially noteworthy when these circuit boards are used in large numbers, and therefore the highest possible quality assurance, which includes optimum testing, is what is important.

Current passage can be produced by a laser beam that proceeds from a static source. The beam is deflected by tiny and extremely light mirrors, so that in the positioning of the beam, only a small mass need be moved into the area of contact of the conductor path to be tested; as mentioned, the process can be carried out much more quickly than is possible in the described prior art.

As the layers that can be applied to the two sides of the circuit board, they can be applied from a plasma that fills a space that is bordered on one side by the circuit board and that is otherwise sealed to such an extent that this plasma cannot flow in.

Here, the plasma has the advantage that it is ionized solely in the area produced by the laser beam, and it becomes electrically conductive.

To determine the permeability of a conductor path that is located on one side of the circuit board, a partitioned layer can be applied that represents a current conductor and that is made alternatingly in the partitions such that in conjunction with the conductor path that is under the plasma layer when serviceability is perfect, a circuit is formed that can be determined by means of a connected measurement device.

According to another idea of the invention, it is provided that on one side of the circuit board a film be placed that represents an equivalent to the indicated plasma layer and on which a partitioned layer is also placed comparably thereto. This layer can be photoconductive and can consist of, for example, organic semiconductors (special polymers).

By applying film to the two sides of the circuit board, the permeability of the conductor paths that are routed through the circuit board and that have contact points on each side can be tested. Here, partitioning of the films can be abandoned since the latter jointly form a circuit in which the measurement device is located at a suitable location. In order to be able to check a conductor path provided on one side with strip conductors in this arrangement, a partitioned film is feasibly used.

A suitable film is a so-called polymer film that becomes conductive in the area irradiated by the laser beam, but impermeable to current again in this area directly after the laser beam is turned off.

This makes it possible to position the laser beam in a very short time sequence at the most varied points so that current can flow through the individual contact points of the circuit board without difficulty. In the case in which this contact point is faulty, i.e., no current is flowing, this is indicated by the measurement technology that is integrated into the circuit.

It can be established at any time, for example by keeping a record, at which contact position the circuit board is faulty.

Other advantageous further developments of the invention are identified in the subclaims.

The process according to the invention and a device for carrying out the process are described below using the attached drawings.

Here:

FIG. 1 shows a device with which circuit boards 1 can be tested for serviceability.

Figure 1:
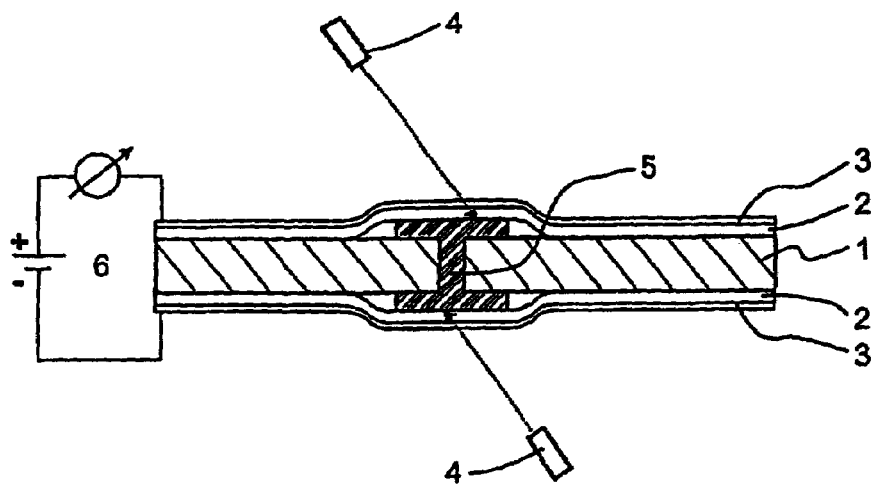
FIG. 1 shows an embodiment of a device for carrying out the process in a schematic side view.

In doing so, current passage through a conductor path 5 that is routed transversely through the circuit board 1 is determined so that on both sides of the circuit board 1, there are contact points that border the conductor path 5.

On the opposing sides of the circuit board 1, one flexible layer 2 that is initially impermeable to current in the form of a polymer film is applied at a time, making contact, of which each is connected to one of the two poles of a voltage source.

Between the transparent layers 2 and the contact points to be tested on the circuit board 1, an electrical field is built up by the applied voltage.

On both sides, there is a transmitter 4 with which a laser beam is produced and preferably deflected and which penetrates the respectively assigned layer 2 in an area of its beam diameter.

In this area, the layer 2 is then permeable to current so that in the case in which the conductor path S is not damaged, the circuit is closed.

A measurement-source device 6 is located between the two layers, connecting them, in order, on the one hand, to apply a voltage difference, and, on the other hand, to ascertain whether current is flowing through the conductor path S or not.

Figure 2:
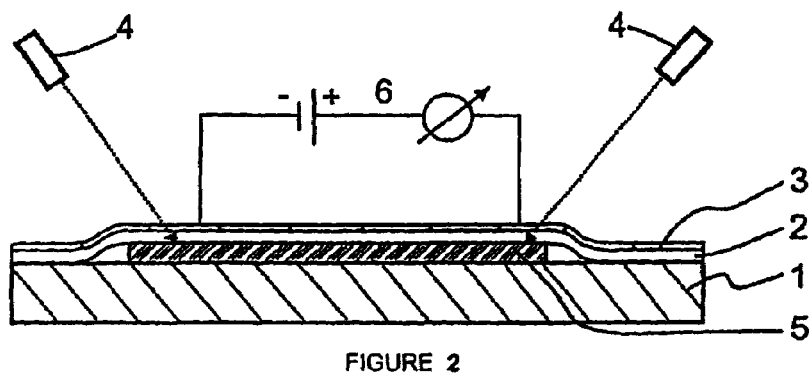
FIG. 2 shows another embodiment of one such device likewise in a schematic side view.
Figure 3:
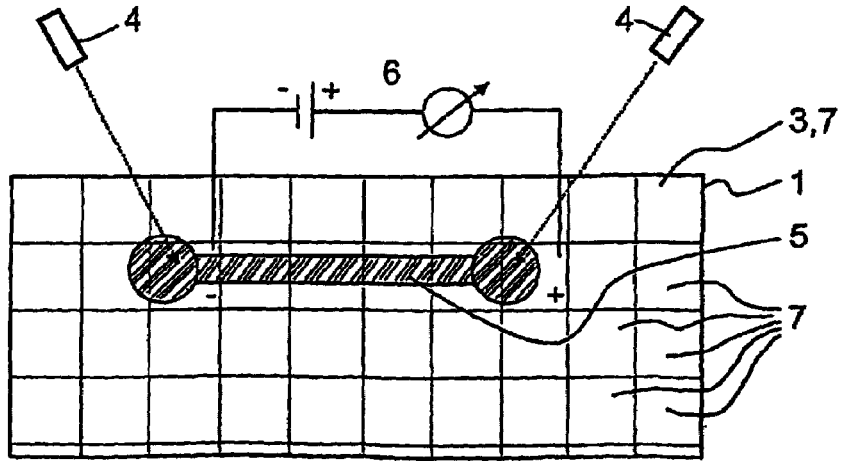
FIG. 3 shows a schematic overhead view of the device according to FIG. 2.

FIGS. 2 and 3 show a device with which a conductor path 5 that is provided only on one side of the circuit board 1 is tested for permeability.

At least in the test area, a current conductor 3 in the form of a layer is applied to the layer 2, preferably making contact as a superficial, transparent electrode, which enables unhindered passage of the laser beam that is shown by the broken line, and that can be made integral with the photoconductive layer 2. In this case, the current conductor 3, i.e., the electrode, forms a carrier layer for the layer 2.

As particularly FIG. 3 clearly shows, the current conductor 3 is partitioned into areas 7 that are arranged in a checkerboard manner having different polarity, wherein a differently polar area 7 is assigned to each contact point terminating a conductor path or track 5.

In this way, an electric circuit is established, to which the measurement-source device 6 is connected, by which the permeability or resistivity of the conductor path 5 can be determined.

The invention claimed is:

1. Process for testing circuit boards for serviceability, which comprises placing a flexible layer (2), that is initially impermeable to current, directly on at least one side of the circuit board (1) so that the layer contacts the board, and is also dynamically connected to a current conductor (3), the layer (2) is then energized and then a current passage is partially created at contact points that delimit the respective conductor path (5) to be tested, and then the current flow in the conductor path (5) is measured via the current conductor (3).

2. Process according to claim 1, wherein the current passage is produced by a laser beam that penetrates the layer (2) in the area of the location of the conductor path (5).

3. Process according to claim 1, wherein a plasma is applied as the layer (2).

4. Process according to claim 1, wherein a polymer film is applied as the layer (2).

5. Process according to claim 4, wherein the polymer film is photoconductive.

6. Process according to claim 1, wherein the current conductor (3) is applied to the entire surface of the layer (2).

7. Device for carrying out the process according to claim 1, which comprises: a circuit board (1), a flexible layer (2), that is initially impermeable to current, placed directly on at least one side of the circuit board (1), a current conductor (3) dynamically connected to layer (2) with means for measuring current flow and transmitters (4) with which one laser beam at a time can be generated by which a partial current passage in the layer (2) can be produced.

8. Device according to claim 7, further comprising mirrors with which the laser beam can be deflected.

9. Device according to claim 7, wherein the current conductor (3) is partitioned into areas (7) that are arranged in a checkerboard manner having different polarity, wherein a differently polar area (7) is assigned to each contact point terminating a conductor track (5).

10. Device according to claim 7, wherein the current conductor (3) consists of a polymer film that lies on the side opposite the layer (2) making contact on the circuit board (1).

11. Device according to claim 10, wherein the polymer film is photoconductive.

12. Device according to claim 7, wherein between the layer (2) and the current conductor (3), there is a measurement device (6) with which current flow through the conductor path (5) can be measured.

13. Device according to claim 12, wherein the current conductor (3) is made as an electrode and is made together with the layer (2) in one piece.

14. Device according to claim 7, wherein the current conductor (3) is made as a superficial, transparent electrode that covers the layer (2) at least in the test area.

15. A process according to claim 1, wherein a flexible layer (2) is placed directly on each side of the circuit board (1), such that a current passage can be created at contact points on differing sides of the circuit board.

16. A process according to claim 1, wherein the current conductor (3) is partitioned into areas (7) that are arranged in a checkerboard manner having different polarity, with a differently polar area (7) is assigned to each contact point terminating a conductor track (5), such that the permeability of a conductor path that is located on one side of the circuit board can be determined.

* * * * *